United States Patent
Kim

(10) Patent No.: US 7,880,524 B2
(45) Date of Patent: Feb. 1, 2011

(54) DLL CIRCUIT AND METHOD OF CONTROLLING THE SAME

(75) Inventor: Kwan Dong Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 44 days.

(21) Appl. No.: 12/345,735

(22) Filed: Dec. 30, 2008

(65) Prior Publication Data

US 2010/0117694 A1 May 13, 2010

(30) Foreign Application Priority Data

Nov. 10, 2008 (KR) .................. 10-2008-0110974

(51) Int. Cl.
*H03H 11/26* (2006.01)
(52) U.S. Cl. .................. 327/284; 327/156; 327/158; 327/276; 327/277
(58) Field of Classification Search .............. 327/156, 327/158, 284
See application file for complete search history.

(56) References Cited

U.S. PATENT DOCUMENTS

| 6,489,823 B2 | 12/2002 | Iwamoto |
| 7,038,511 B2 | 5/2006 | Kim et al. |
| 7,282,972 B2 * | 10/2007 | Lin .................. 327/158 |

FOREIGN PATENT DOCUMENTS

| JP | 2000-195263 A | 7/2000 |
| KR | 10-0837810 B1 | 6/2008 |

* cited by examiner

*Primary Examiner*—Lincoln Donovan
*Assistant Examiner*—John W Poos
(74) *Attorney, Agent, or Firm*—Ladas & Parry LLP

(57) ABSTRACT

A DLL circuit includes a delay unit configured to generate a DLL clock signal by delaying a reference clock signal while adjusting a delay amount in response of a level of a control voltage. An initial operation control unit is configured to control an initial level of the control voltage and generate a detection enable signal. A delay control unit is configured to generate the control voltage by comparing a phase of the reference clock signal and a phase of the DLL clock signal in response to the detection enable signal.

20 Claims, 9 Drawing Sheets

DLL CIRCUIT AND METHOD OF CONTROLLING THE SAME

CROSS-REFERENCES TO RELATED APPLICATION

The present application claims priority under 35 U.S.C. 119(a) to Korean application number 10-2008-0110974, filed on Nov. 10, 2008, in the Korean Intellectual Property Office, which is incorporated herein by reference in its entirety as if set forth in full.

BACKGROUND

The present invention relates generally to a semiconductor integrated circuit, and more particularly to a delay locked loop (DLL) circuit used for a semiconductor integrated circuit and a method of controlling the same.

A conventional semiconductor integrated circuit synchronizes output data signals with an internal clock signal thereby improving the operating speed thereof. To synchronize the output data signals with the internal clock the conventional semiconductor integrated circuit includes a clock generator such as a DLL circuit. Recent design trends in the semiconductor industry include the increase in operation speeds of semiconductor integrated circuits. As the semiconductor integrated circuit continues to operate at higher speeds, technology for subdividing a phase of the internal clock signal to generate a multiphase internal clock signal and synchronizing data signals with each phase has been developed. With the development of such technology, the DLL circuit is implemented as a multiphase DLL circuit. Presently, a DLL clock signal is realized as a plurality of clocks having predetermined phase differences each other.

The conventional multiphase DLL circuit is implemented as an analog type and controls a phase of the DLL clock signal by supplying a control voltage obtained through a voltage pumping operation to a delay line. In the conventional multiphase DLL circuit a short locking time is required. When the locking time of the conventional multiphase DLL circuit is long, the plural clock signals in the DLL clock signal, which must have phase differences obtained by equally dividing one period of the DLL clock signal, are subject to errors such, e.g., harmonic lock or sub-harmonic lock, resulting in the plural clock signals in the DLL clock signal having phase differences obtained by equally dividing two or more periods of the DLL clock signal. In order to prevent such errors, the control voltage must have a proper level in an initial operation of the multiphase DLL circuit. However, the conventional multiphase DLL circuit has not been provided with a technical configuration capable of controlling the level of the control voltage in the initial operation. Thus, a multiphase DLL clock signal may not be stably operated.

SUMMARY

A multiphase DLL circuit having short locking time and a method of controlling the same are described herein.

A DLL circuit capable of preventing an abnormal operation such as harmonic lock or sub-harmonic lock when a multiphase clock signal is generated, and a method of controlling the same are described herein.

According to one aspect of the present invention, a delay unit configured to generate a DLL clock signal by delaying a reference clock signal and adjust a delay amount in response to a level of a control voltage, an initial operation control unit configured to control an initial level of the control voltage and generate a detection enable signal, and a delay control unit configured to generate the control voltage by comparing a phase of the reference clock signal with a phase of the DLL clock signal in response to the detection enable signal.

According to another aspect of the present invention, a DLL circuit includes an initial operation control unit configured to decrease a level of a control voltage to a reference level in an initial operation and then enable a detection enable signal, a phase detector configured to generate a phase detection signal by comparing a phase of a reference clock signal and a phase of a DLL clock signal in response to the detection enable signal, a charge pump configured to generate a pumping voltage through a voltage pumping operation in response to the phase detection signal, and a low pass filter configured to generate the control voltage by filtering the pumping voltage.

According to further another aspect of the present invention, a method of controlling a DLL circuit includes controlling a level of a control voltage such that the level of the control voltage is less than a reference level and enabling a detection enable signal, enabling a phase up signal in response to the detection enable signal, increasing the level of the control voltage in response to the phase up signal, and generating a DLL clock signal by delaying a reference clock signal in response to the control voltage.

These and other features, aspects, and embodiments are described below in the section entitled "Detailed Description."

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DETAILED DESCRIPTION

Hereinafter, embodiments of the present invention will be described with reference to the accompanying drawings.

Figure 1:
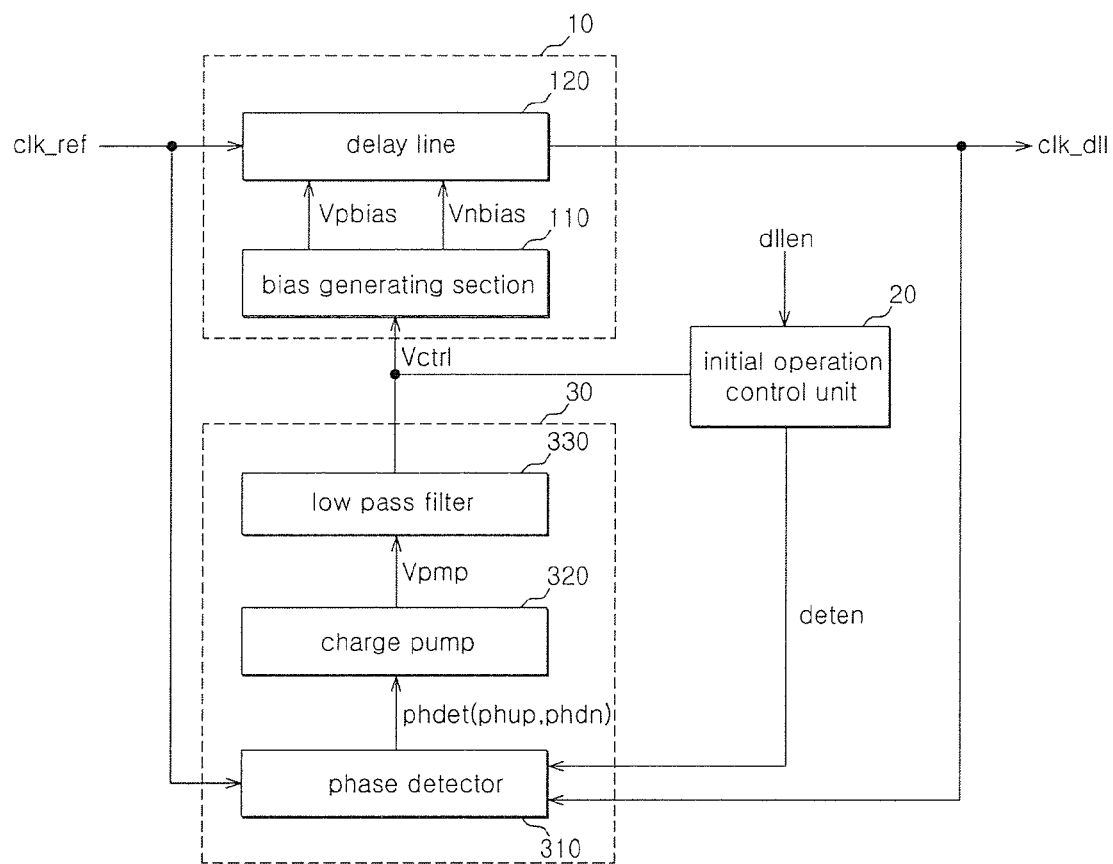
FIG. 1 is a block diagram showing a DLL circuit in accordance with an embodiment of the invention.

FIG. 1 is a block diagram showing an example of a DLL circuit in accordance with one embodiment of the invention.

As shown in FIG. 1, the DLL circuit may include a delay unit 10, an initial operation control unit 20, and a delay control unit 30.

According to the embodiment shown in FIG. 1, the delay unit 10 is configured to generate a DLL clock signal 'clk_dll' by delaying a reference clock signal 'clk_ref' in response to a level of a control voltage 'Vctrl'. The delay unit 10 may include a bias generating section 110 and a delay line 120.

The bias generator 110 can be configured to generate a pull-up bias voltage 'Vpbias' and a pull-down bias voltage 'Vnbias' in response to the level of the control voltage 'Vctrl'. The delay line 120 can be configured to output the DLL clock signal 'clk_dll' by delaying the reference clock signal 'clk_ref' in response to both the pull-up bias voltage 'Vpbias' and the pull-down bias voltage 'Vnbias'.

The delay unit 10 generates the DLL clock signal 'clk_dll' by delaying the reference clock signal 'clk_ref' and adjusting the delay amount of the reference clock signal 'clk_ref' in response to the level of the control voltage 'Vctrl'. Herein, it is assumed, according to the present embodiment, that if the level of the control voltage 'Vctrl' is increased, the delay unit 10 delays a phase of the DLL clock signal 'clk_dll', and if the level of the control voltage 'Vctrl' is decreased, the delay unit 10 advances a phase of the DLL clock signal 'clk_dll'. The delay unit 10 can generate a multiphase clock. The DLL clock signal 'clk_dll' refers to one clock of a plurality of clocks having predetermined phase differences each another.

When a DLL enable signal 'dllen' is enabled, the initial operation control unit 20 generates a detection enable signal 'deten' by controlling an initial level of the control voltage 'Vctrl'. When the DLL circuit starts to operate and the DLL enable signal 'dllen' is enabled, the initial operation control unit 20 decreases the level of the control voltage 'Vctrl'. Subsequently, if the level of the control voltage 'Vctrl' reaches a predetermined reference level, the initial operation control unit 20 enables the detection enable signal 'deten'. The detection enable signal 'deten' can be input from the outside of the DLL circuit through a pad (not shown).

When the detection enable signal 'deten' is enabled, the delay control unit 30 generates the control voltage 'Vctrl' by comparing a phase of the reference clock signal 'clk_ref' with a phase of the DLL clock signal 'clk_dll'. The delay control unit 30 may include a phase detector 310, a charge pump 320, and a low pass filter 330.

When the detection enable signal 'deten' is enabled, the phase detector 310 generates a phase detection signal 'phdet' by comparing the phase of the reference clock signal 'clk_ref' with the phase of the DLL clock signal 'clk_dll'. The charge pump 320 can be configured to generate a pumping voltage 'Vpmp' by performing a voltage a pumping operation in response to the phase detection signal 'phdet'. The low pass filter 330 can be configured to generate the control voltage 'Vctrl' by filtering the pumping voltage 'Vpmp'.

The phase detection signal 'phdet', which is generated by the phase detector 310, includes a phase up signal 'phup' and a phase down signal 'phdn'. The phase up signal 'phup' and the phase down signal 'phdn' can be implemented as pulse signals, respectively. Only one of the phase up signal 'phup' and the phase down signal 'phdn' is enabled, and the signal that is enabled is determined according to the phase difference between the reference clock signal 'clk_ref' and the DLL clock signal 'clk_dll'. When the phase up signal 'phup' is enabled, the charge pump 320 increases a level of the pumping voltage 'Vpmp', and when the phase down signal 'phdn' is enabled, the charge pump 320 decreases the level of the pumping voltage 'Vpmp'.

That is, when the DLL circuit starts to operate, the initial operation control unit 20 controls the level of the control voltage 'Vctrl' to be less than a predetermined reference level and enables the detection enable signal 'deten'. The phase detector 310 starts to operate as the detection enable signal 'deten' is enabled. According to the present embodiment, the phase up signal 'phup' is enabled prior to the phase down signal 'phdn' at first. When the phase up signal 'phup' is enabled, the charge pump 320 increases the level of the pumping voltage 'Vpmp', and as a result, the level of the control voltage 'Vctrl' is increased. Thus, the phase of the DLL clock 'clk_dll' is gradually shifted backward.

Thereafter, the detection enable signal 'deten' is maintained in the enabled state. Thus, the phase detector 310 continuously compares the phase of the reference clock signal 'clk_ref' with the phase of the DLL clock signal 'clk_dll' so as to enable the phase up signal 'phup' or the phase down signal 'phdn'. Through this, the level of the control voltage 'Vctrl' is increased or decreased. Subsequently, if the level of the control voltage 'Vctrl' reaches a predetermined level, the delay lock operation of the DLL circuit is completed because the DLL clock signal 'clk_dll' has a phase difference of one period relative to the reference clock signal 'clk_ref'.

In the DLL circuit in accordance with an embodiment of the present invention, as described above, the level of the control voltage 'Vctrl' in the initial operation of the DLL circuit is set approximately to an expected level of the control voltage 'Vctrl' when the locking is completed. Thus, the locking time of the DLL circuit can be shortened. Further, since variation in the level of the control voltage 'Vctrl' is not large until the locking time point, the level of the control voltage 'Vctrl' may not exceed a predetermined range. Thus, a multiphase clock can be generated more stably.

Figure 2:
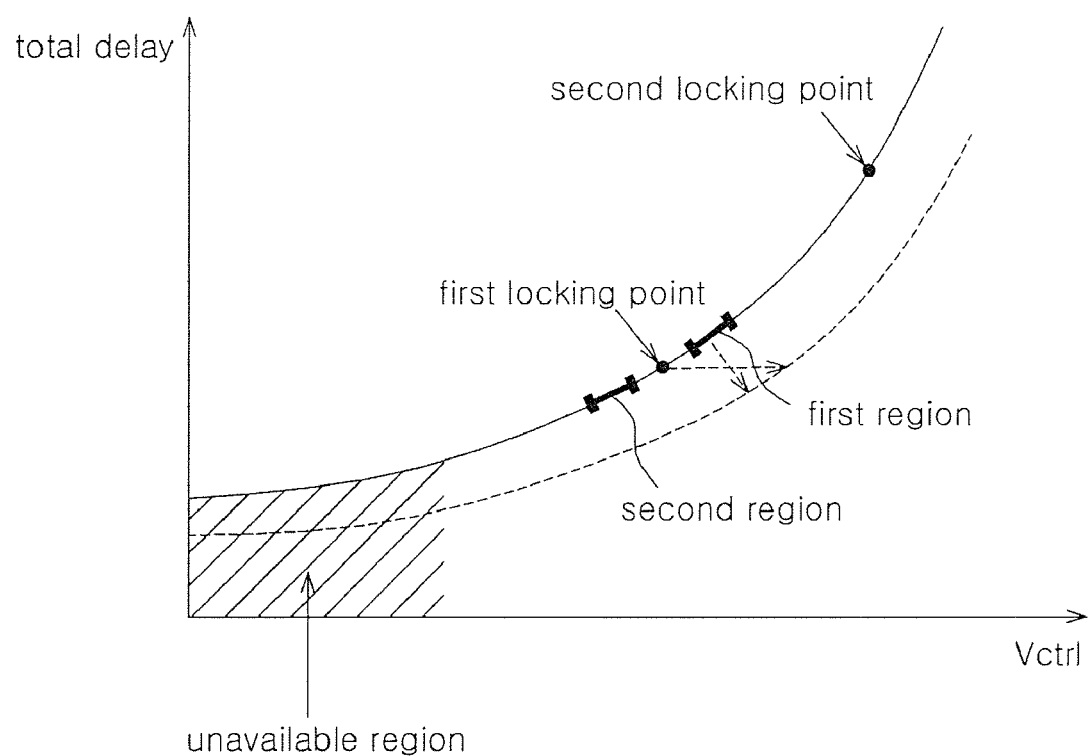
FIG. 2 is a graph shown for illustrating an operation of the DLL circuit shown in FIG. 1.

FIG. 2 is a graph shown for illustrating an operation of the DLL circuit shown in FIG. 1.

In the graph shown in FIG. 2, the horizontal axis denotes the level of the control voltage 'Vctrl' and the vertical axis denotes the total delay applied to the reference clock signal 'clk_ref' from the delay line 120 when the DLL clock signal 'clk_dll' is generated. The solid curved line on the graph denotes variation in the total delay as the level of the control voltage 'Vctrl' is changed.

The solid curved line shown in FIG. 2 includes first and second locking points. The first locking point indicates the point at which the locking exactly occurs. If the control voltage 'Vctrl' reaches the first locking point, the DLL clock signal 'clk_dll' is uniformly divided with the predetermined phase difference. For example, if the DLL clock signal 'clk_dll' is a set of clock signals having eight phases, with phase differences between clock signals being 45°.

Further, the second locking point indicates the point at which a locking error occurs. If the control voltage 'Vctrl' reaches the second locking point, the DLL clock signal 'clk_dll' is uniformly divided to have a phase difference twice as large as the predetermined phase difference. For example, if the DLL clock signal 'clk_dll' is a set of clocks having eight phases, with phase differences between clock signals being 90°.

Further, the graph includes first and second regions, denoted by thick black bars on the solid curved line, for setting an initial level of the control voltage 'Vctrl'. The first and second regions are positioned adjacent to the first locking point. When the initial level of the control voltage 'Vctrl' is set in the first region, the DLL circuit must decrease the level of the control voltage 'Vctrl' in the initial operation thereof. However, the solid curved line may be changed into the broken curved line marked (indicated by the dotted lines) as process/voltage/temperature (PVT) variation occurs in a semiconductor integrated circuit. In this case, the first locking point and the first region are changed as indicated by the broken arrows marked. In such a state, if the DLL circuit reduces the control voltage 'Vctrl' in the initial operation thereof, the control voltage 'Vctrl' may be reduced to an unavailable region marked by diagonal lines in the lower left hand region of FIG. 2.

Thus, the DLL circuit, according to an embodiment of the invention, sets the initial level of the control voltage 'Vctrl' in the second region and then gradually increases the level of the control voltage 'Vctrl', thereby preventing the abnormal operation as described above. To this end, the phase detector 310 initially outputs the phase up signal 'phup' and, subsequently, the charge pump 320 increases the level of the pumping voltage 'Vpmp'.

Figure 3:
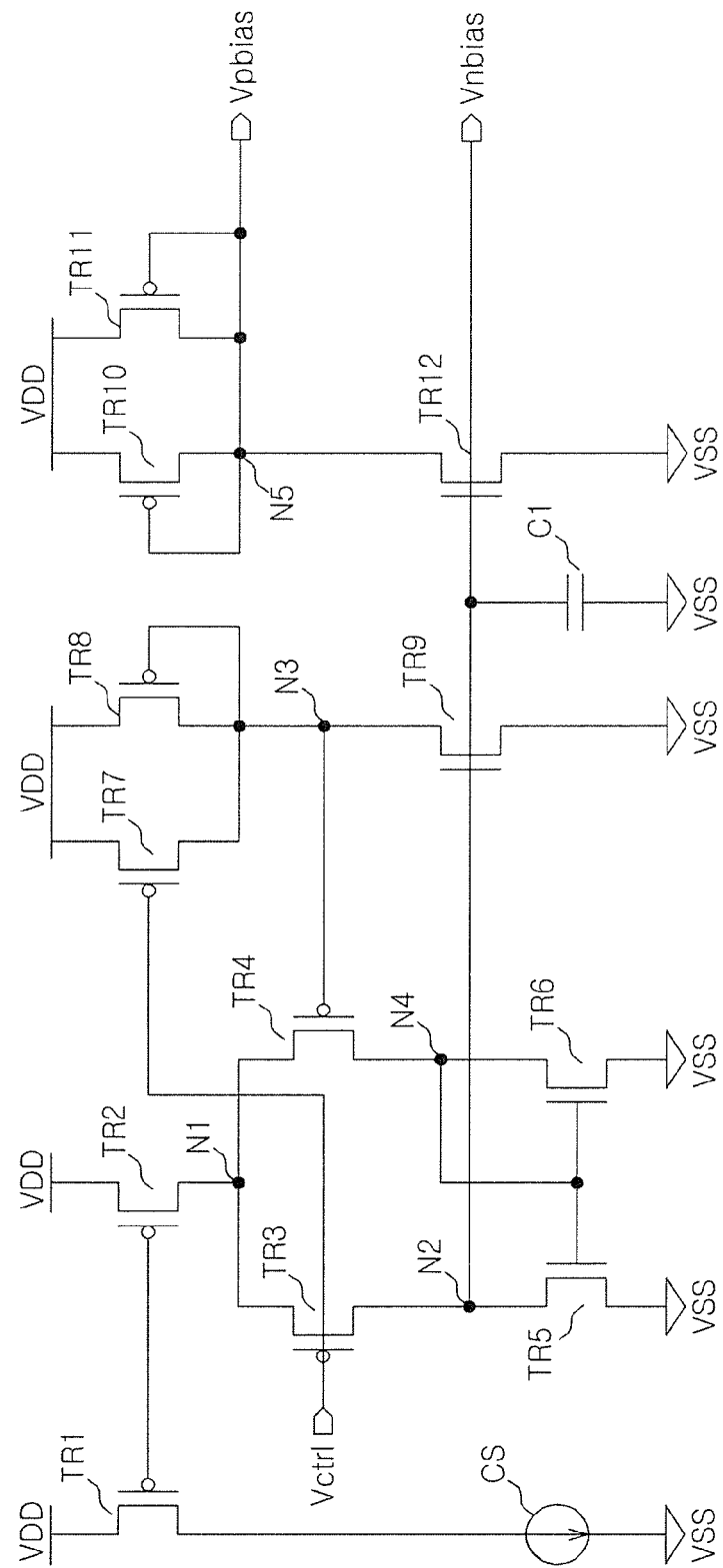
FIG. 3 is a detailed circuit diagram of an example of a bias generating section shown in FIG. 1.

FIG. 3 is a detailed circuit diagram of an example of the bias generating section 110 shown in FIG. 1.

As shown in FIG. 3, the bias generator 110 can include first to twelfth transistors TR1 to TR12, a current source CS, and a first capacitor C1.

As shown in FIG. 3, the source of the first transistor TR1 may be configured to receive an external supply voltage 'VDD'. The current source CS is provided between a drain of the first transistor TR1 and a ground terminal VSS. The second transistor TR2 can include a gate coupled to the gate of the first transistor TR1, a source receiving the external supply voltage 'VDD', and a drain coupled to a first node 'N1'. The third transistor TR3 may be configured such that a gate thereof receives the control voltage 'Vctrl', a source thereof is coupled to the first node 'N1', and a thereof drain is coupled with a second node 'N2'. The fourth transistor TR4 may be configured such that a gate thereof is coupled to a third node 'N3', a source thereof is coupled to the first node 'N1', and a drain thereof is coupled to a fourth node 'N4'. The fifth transistor TR5 may be configured such that a gate thereof is coupled to the fourth node 'N4', a drain thereof is coupled to the second node 'N2', and a source thereof grounded. The sixth transistor TR6 can be configured such that a gate and a drain thereof are both coupled to the fourth node 'N4', and a source thereof is grounded to the ground terminal VSS.

The seventh transistor TR7 may be configured such that a gate thereof receives the control voltage 'Vctrl', a source thereof receives the external supply voltage 'VDD', and a drain thereof is coupled with the third node 'N3'. The eighth transistor TR8 can include a gate and a drain coupled with the third node 'N3', and a source of the eighth transistor TR8 can receive the external supply voltage 'VDD'. The ninth transistor TR9 may be configured such that a gate thereof is coupled to the second node 'N2', a drain thereof is coupled to the third node 'N3', and a source thereof grounded to the ground terminal VSS. The tenth transistor TR10 may be configured such that both a gate and a drain thereof are coupled to a fifth node 'N5', and a source thereof receives the external supply voltage 'VDD'. The eleventh transistor TR11 may be configured such that both a gate and a drain thereof are coupled to the fifth node 'N5', and a source thereof is receives the external supply voltage 'VDD'. The twelfth transistor TR12 may be configured such that a gate thereof is coupled to the second node 'N2', a drain thereof is coupled with the fifth node 'N5', and a source thereof is grounded to the ground terminal VSS. The first capacitor C1 is provided between the second node 'N2' and the ground terminal VSS.

According to the present embodiment, the voltage at the second node 'N2' is the pull-down bias voltage 'Vnbias' and the voltage at the fifth node 'N5' is the pull-up bias voltage 'Vpbias'.

In the bias generator 110, configured as described above, if the level of the control voltage 'Vctrl' is increased a voltage level of the third node 'N3' is decreased and a voltage level of the fourth node 'N4' is increased. Thus, a level of the pull-down bias voltage 'Vnbias' applied to the second node 'N2' is decreased and a level of the pull-up bias voltage 'Vpbias' applied to the fifth node 'N5' is increased accordingly.

Similarly, if the level of the control voltage 'Vctrl' is decreased the voltage level of the third node 'N3' is increased and a voltage level of the fourth node 'N4' is decreased. Thus, the level of the pull-down bias voltage 'Vnbias' applied to the second node 'N2' is increased and the level of the pull-up bias voltage 'Vpbias' applied to the fifth node 'N5' is decreased accordingly.

Figure 4:
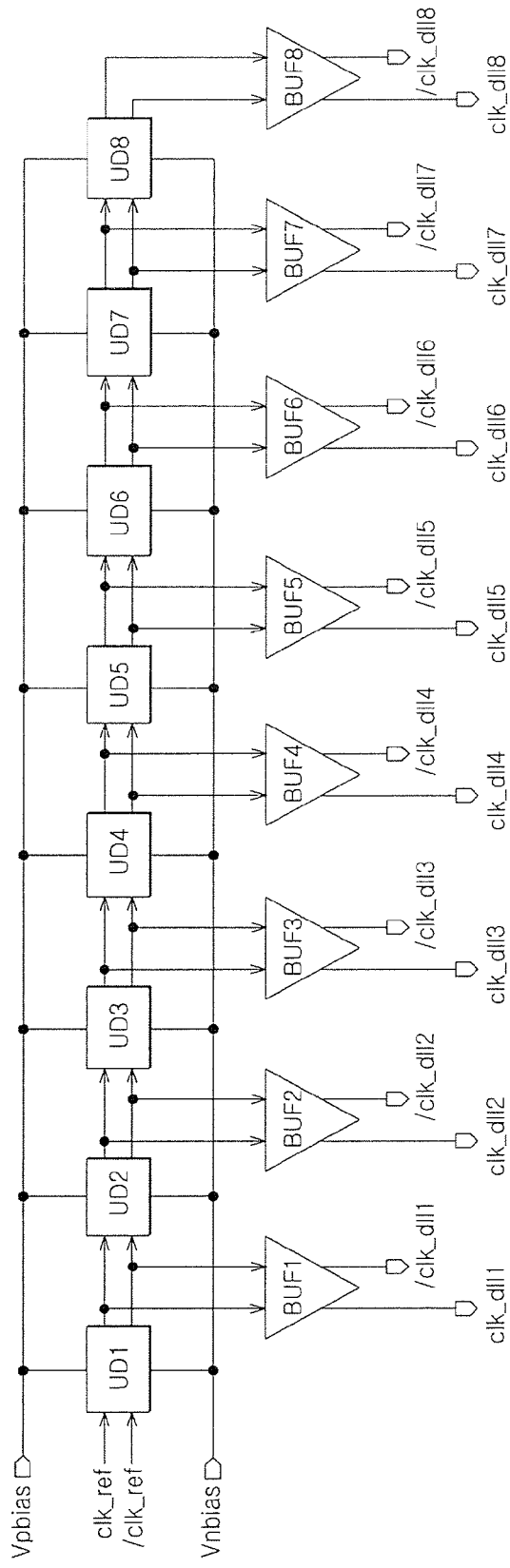
FIG. 4 is a detailed circuit diagram of an example of a delay line shown in FIG. 1.

FIG. 4 is a detailed circuit diagram of an example of the delay line 120 shown in FIG. 1. The DLL clock signal 'clk_dll' is implemented as a set of eight clock signals 'clk_dll1' to 'clk_dll8', each having predetermined phase differences from the others. The following description will be given on the assumption that the reference clock signal 'clk_ref' and the DLL clock signal 'clk_dll' are implemented as clock signal pairs (e.g. 'clk_ref', '/clk_ref', and 'clk_dll', '/clk_dll'), respectively.

As shown in FIG. 4, the delay line 120 can include first to eighth unit delayers 'UD1' to 'UD8', and first to eighth buffers 'BUF1' to 'BUF8'.

The first to eighth unit delayers 'UD1' to 'UD8' are configured to delay signal pairs output from previous stages (previous unit delayers) in response to both the pull-up bias voltage 'Vpbias' and the pull-down bias voltage 'Vnbias' so as to generate output signal pairs. The generated output signal pairs are transferred to the next, or subsequent, stages, respectively. The first to eighth buffers 'BUF1' to 'BUF8' are configured to buffer the output signal pairs generated by the first to eighth unit delayers 'UD1' to 'UD8' so as to output first to eighth DLL clock signal pairs 'clk_dll1', '/clk_dll1' to 'clk_dll8', '/clk_dll8', respectively.

The first unit delayer 'UD1' receives and delays the reference clock signal pair 'clk_ref', '/clk_ref'.

The first to eighth DLL clock signal pairs 'clk_dll1' to 'clk_dll8', output from the delay line 120 having the above configuration, must have phases obtained by dividing one period of the reference clock signal 'clk_ref' into eight sections. At this time, if the level of the pull-up bias voltage 'Vpbias' is increased and the level of the pull-down bias voltage 'Vnbias' is decreased accordingly, the delay line 120 increases the delay amount applied to the reference clock signal 'clk_ref', thereby delaying the phase of the DLL clock signal 'clk_dll'. In contrast, if the level of the pull-up bias voltage 'Vpbias' is decreased and the level of the pull-down bias voltage 'Vnbias' is increased accordingly, the delay line 120 reduces the delay amount applied to the reference clock signal 'clk_ref', thereby advancing the phase of the DLL clock signal 'clk_dll'.

Figure 5:
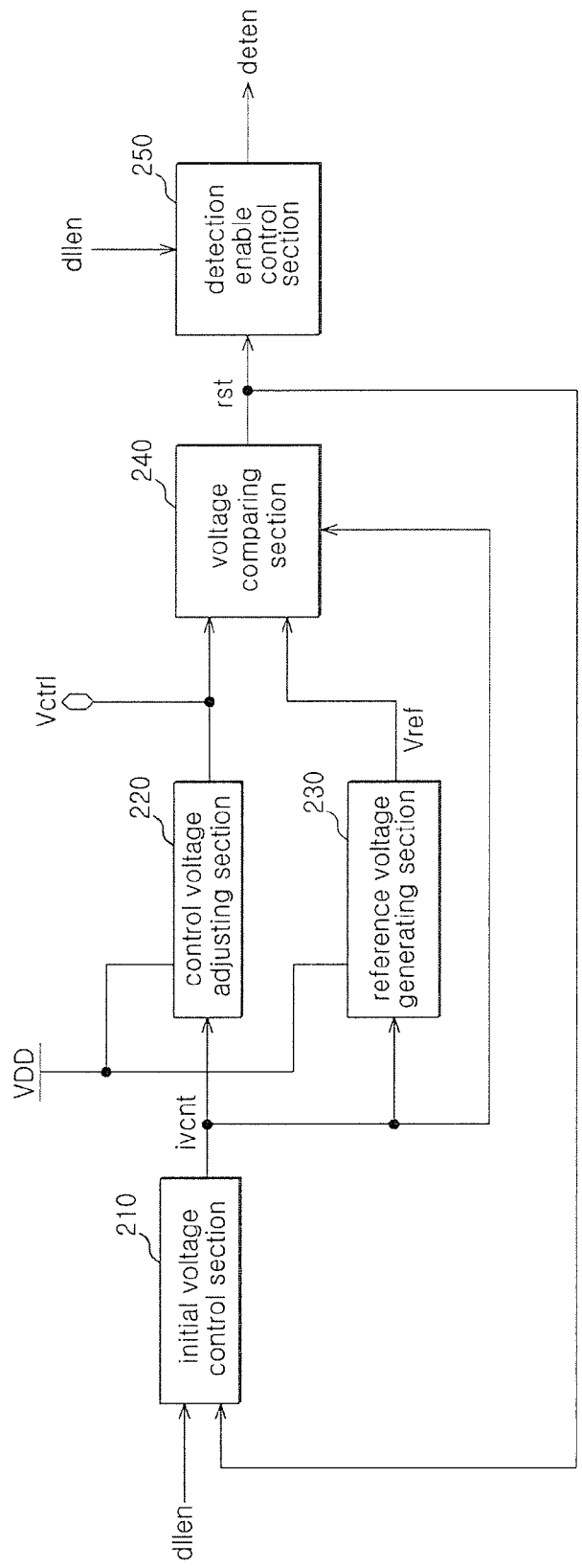
FIG. 5 is a detailed circuit diagram of an example of an initial operation control unit shown in FIG. 1.

FIG. 5 is a detailed circuit diagram of an example of the initial operation control unit 20 shown in FIG. 1.

As shown in FIG. 5, the initial operation control unit 20 can include an initial voltage control section 210, a control voltage adjusting section 220, a reference voltage generating section 230, a voltage comparing section 240, and a detection enable control section 250.

The initial voltage control section 210 can be configured to generate an initial voltage control signal 'ivcnt' in response to the DLL enable signal 'dllen' and a reset signal 'rst'. The control voltage adjusting section 220 can be configured to adjust the level of the control voltage 'Vctrl' in response to the external supply voltage 'VDD' and the initial voltage control signal 'ivcnt'. The reference voltage generating section 230 can be configured to generate the reference voltage 'Vref' in response to the external supply voltage 'VDD' and the initial voltage control signal 'ivcnt'. The voltage comparing section 240 can be configured to generate the reset signal 'rst' by comparing the level of the reference voltage 'Vref' and the level of the control voltage 'Vctrl', which is adjusted in response to the initial voltage control signal 'ivcnt'. The detection enable control section 250 can be configured to generate the detection enable signal 'deten' in response to the DLL enable signal 'dllen' and the reset signal 'rst'.

The initial voltage control section 210 can be configured to disable the initial voltage control signal 'ivcnt' before the DLL enable signal 'dllen' is enabled. Subsequently, the initial voltage control section 210 enables the initial voltage control signal 'ivcnt' as the DLL enable signal 'dllen' is enabled. An enable interval of the initial voltage control signal 'ivcnt' can be maintained only to the timing at which the reset signal 'rst' is enabled.

The control voltage adjusting section 220 sets the control voltage 'Vctrl' to have a voltage level identical to that of the external supply voltage 'VDD' before the initial voltage control signal 'ivcnt' is enabled. Then, when the initial voltage control signal 'ivcnt' is enabled, the control voltage adjusting section 220 decreases the level of the control voltage 'Vctrl'. When the initial voltage control signal 'ivcnt' is disabled again, the control voltage adjusting section 220 stops decreasing the control voltage 'Vctrl'.

When the initial voltage control signal 'ivcnt' is enabled, the reference voltage generating section 230 divides the external supply voltage 'VDD' according to a resistance ratio of resistors provided therein, thereby generating the reference voltage 'Vref'. At this time, the level of the reference voltage 'Vref' is identical to the reference level of the control voltage 'Vctrl' as described above. Referring to the graph shown in FIG. 2, since the control voltage 'Vctrl' must initially have the level in the second region, the reference voltage 'Vref' is set to a level identical to the initial level of the control voltage 'Vctrl'.

When the initial voltage control signal 'ivcnt' is enabled, if the level of the control voltage 'Vctrl' is greater than that of the reference voltage 'Vref', the voltage comparing section 240 maintains the disabled state of the reset signal 'rst'. In contrast, if the level of the control voltage 'Vctrl' is less than that of the reference voltage 'Vref', the voltage comparing section 240 enables the reset signal 'rst'. Subsequently, if the initial voltage control signal 'ivcnt' is disabled, the voltage comparing section 240 disables the reset signal 'rst'.

If the DLL enable signal 'dllen' is enabled, the detection enable control section 250 disables the detection enable signal 'deten' and then, if the reset signal 'rst' is enabled, the detection enable control section 250 enables the detection enable signal 'deten'. Subsequently, the detection enable control section 250 maintains the enabled state of the detection enable signal 'deten' regardless of the state of the reset signal 'rst'.

In detail, if the DLL circuit starts to operate while the DLL enable signal 'dllen' is enabled, the initial voltage control section 210 of the initial operation control unit 20 enables the initial voltage control signal 'ivcnt'. Thus, the reference voltage generating section 230 starts to generate the reference voltage 'Vref' having a predetermined level, and the control voltage adjusting section 220 starts to decrease the level of the control voltage 'Vctrl'. The voltage comparing section 240 compares the level of the reference voltage 'Vref' with the level of the control voltage 'Vctrl'. Then, if the level of the control voltage 'Vctrl' is lower than that of the reference voltage 'Vref', the voltage comparing section 240 enables the reset signal 'rst'. The initial voltage control section 210 disables the initial voltage control signal 'ivcnt' in response to the reset signal 'rst', and the detection enable control section 250 enables the detection enable signal 'deten' in response to the reset signal 'rst'. Then, the detection enable control section 250 maintains the enabled state of the detection enable signal 'deten' even if the reset signal 'rst' is disabled.

As described above, the initial operation control unit 20 decreases the level of the control voltage 'Vctrl' in the initial operation of the DLL circuit, and then enables the detection enable signal 'deten' if the level of the control voltage 'Vctrl' is decreased to a level less than the reference level. Thus, the delay control unit 30 operates only when the level of the control voltage 'Vctrl' is less than the reference level. As a result, a DLL circuit stably generating a multiphase clock with fast locking time is achieved.

Figure 6:
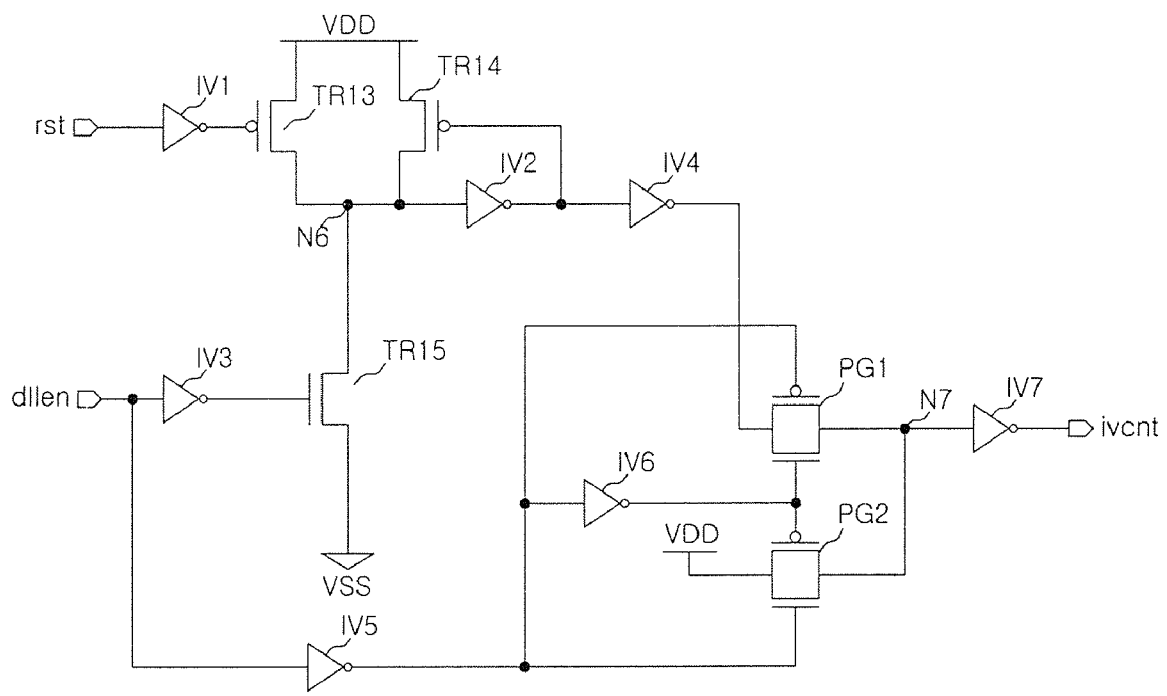
FIG. 6 is a detailed circuit diagram of an example of an initial voltage control section shown in FIG. 5.

FIG. 6 is a detailed circuit diagram of an example of the initial voltage control section 210 shown in FIG. 5.

As shown in FIG. 6, the initial voltage control section 210 can include first to seventh inverters 'IV1' to 'IV7', thirteenth to fifteenth transistors 'TR13' to 'TR15', and first and second pass gates 'PG1' to 'PG2'.

The first inverter 'IV1' can be configured to receive the reset signal 'rst'. The thirteenth transistor 'TR13' may be configured to include a gate receiving a signal output by the first inverter 'IV1', a source receiving the external supply voltage 'VDD', and a drain coupled to a sixth node 'N6'. The second inverter 'IV2' can be configured to receive the voltage of the sixth node 'N6'. The fourteenth transistor 'TR14' may be configured such that a gate thereof receives a signal output by the second inverter 'IV2', a source thereof receives the external supply voltage 'VDD', and a drain thereof is coupled to the sixth node 'N6'. The third inverter 'IV3' can be configured to receive the DLL enable signal 'dllen'. The fifteenth transistor 'TR15' may be configured such that a gate thereof receives an output signal of the third inverter 'IV3', a drain thereof is coupled to the sixth node 'N6', and a source thereof is grounded to a ground terminal VSS.

The fourth inverter 'IV4' can be configured to receive the signal output by the second inverter 'IV2'. The fifth inverter 'IV5' can be configured to receive the DLL enable signal 'dllen'. The sixth inverter 'IV6' can be configured to receive the signal output by the fifth inverter 'IV5'. The first pass gate 'PG1' may be configured to transfer a signal output by the fourth inverter 'IV4' to a seventh node 'N7' in response to both the output signal of the fifth inverter 'IV5' and an output signal of the sixth inverter 'IV6'. The second pass gate 'PG2' may be configured to transfer the external supply voltage 'VDD' to the seventh node 'N7' in response to the output signal of the fifth inverter 'IV5' and the output signal of the sixth inverter 'IV6'. The seventh inverter 'IV7' may be configured to receive a voltage applied to the seventh node 'N7' and output the initial voltage control signal 'ivcnt'.

According to the initial voltage control section 210, configured as described above, the initial voltage control signal 'ivcnt' is disabled prior to the enabling of the DLL enable signal 'dllen', because the first pass gate 'PG1' is turned off and the second pass gate 'PG2' is turned on. In contrast, when the DLL enable signal 'dllen' is enabled, the low level voltage of the sixth node 'N6' is transferred to the first pass gate 'PG1' through the second and fourth inverters 'IV2' to 'IV4'. In such a case, since the first pass gate 'PG1' is turned on, the initial voltage control signal 'ivcnt' is enabled. Subsequently, if the reset signal 'rst' is enabled, thereby 'turning on' the thirteenth transistor 'TR13', the sixth node 'N6' has a high level voltage, and as a result, the initial voltage control signal 'ivcnt' is disabled.

That is, the initial voltage control signal 'ivcnt' is enabled as the DLL enable signal 'dllen' is enabled. Further, the initial voltage control signal 'ivcnt' is disabled as the reset signal 'rst' is enabled.

Figure 7:
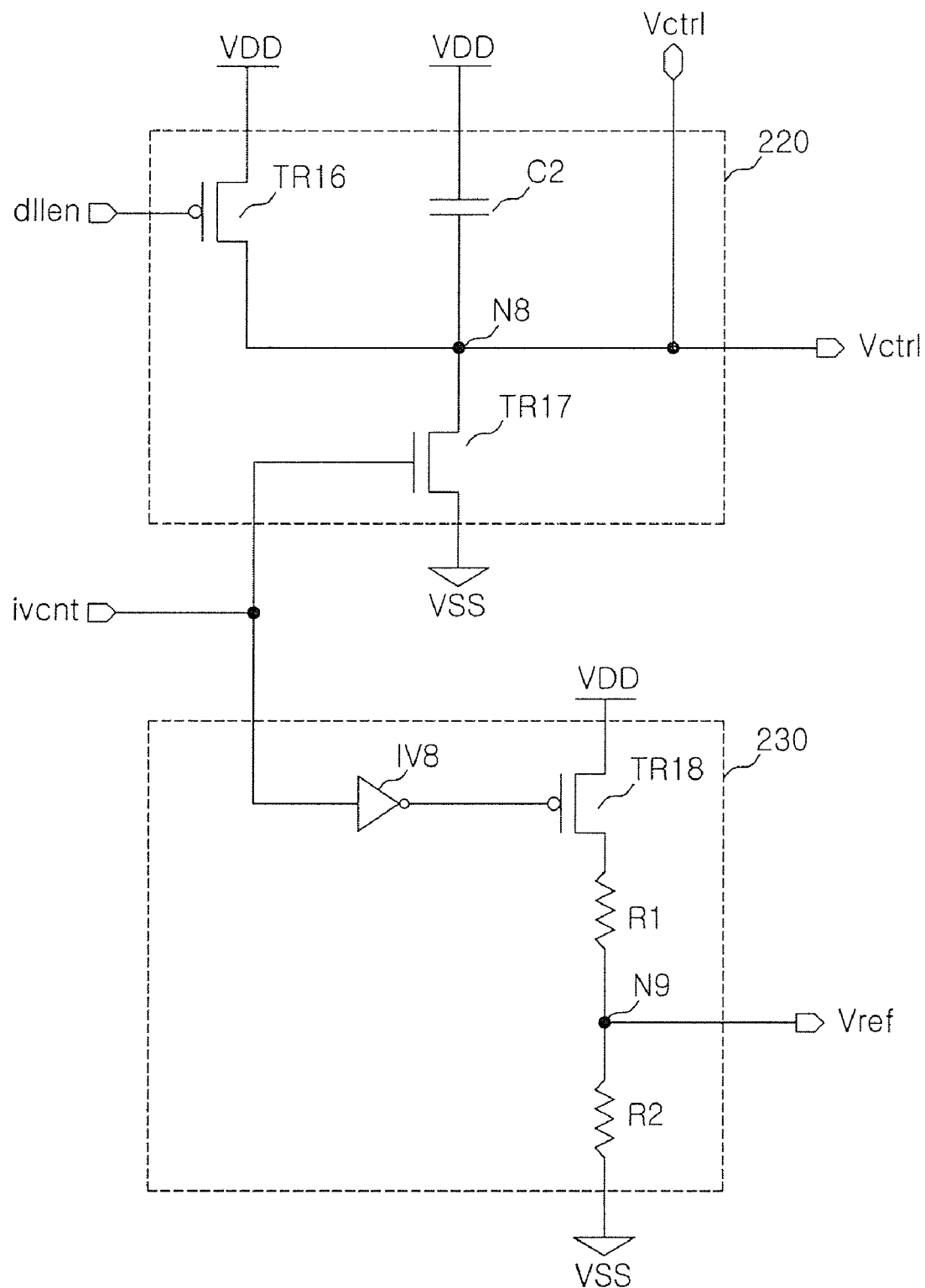
FIG. 7 is a detailed circuit diagram of an example of a control voltage adjusting section and a reference voltage generating section shown in FIG. 5.

FIG. 7 is a detailed circuit diagram of an example of the control voltage adjusting section 220 and the reference voltage generating section 230 shown in FIG. 5.

As shown in FIG. 7, the control voltage adjusting section 220 can include an eighth node 'N8', sixteenth and seventeenth transistors 'TR16' and 'TR17', and a second capacitor 'C2'.

The control voltage 'Vctrl' is applied to the eighth node 'N8'. The sixteenth transistor 'TR16' may be configured such that a gate thereof receives the DLL enable signal 'dllen', a source thereof receives the external supply voltage 'VDD', and a drain thereof is coupled to the eighth node 'N8'. The second capacitor 'C2' is provided between a supply terminal of the external supply voltage 'VDD' and the eighth node 'N8'. The seventeenth transistor 'TR17' may be configured such that a gate thereof receives the initial voltage control signal 'ivcnt', a drain thereof is coupled to the eighth node 'N8', and a source thereof is grounded to the ground terminal VSS.

Further, the reference voltage generating section 230 can include a ninth node 'N9', an eighth inverter 'IV8', an eighteenth transistor 'TR18', and first and second resistors 'R1' and 'R2'.

The ninth node 'N9' can be configured to output the reference voltage 'Vref'. The eighth inverter 'IV8' can be configured to receive the initial voltage control signal 'ivcnt'. The eighteenth transistor 'TR18' can be configured such that a gate thereof receives an output signal of the eighth inverter 'IV8' and a source thereof receives the external supply voltage 'VDD'. The first resistor 'R1' is provided between a drain of the eighteenth transistor 'TR18' and the ninth node 'N9'. The second resistor 'R2' is provided between the ninth node 'N9' and the ground voltage 'VSS' terminal.

The control voltage 'Vctrl' transferred from the low pass filter 330 of the delay control unit 30 is applied to the eighth node 'N8' of the control voltage adjusting section 220. However, before the operation of the delay control unit 30 is activated, the delay control unit 30 does not substantially generate the control voltage 'Vctrl'. In such a case, since the external supply voltage 'VDD' was supplied to the eighth node 'N8' through the sixteenth transistor 'TR16' when the DLL enable signal 'dllen' was in a disabled state, the level of the control voltage 'Vctrl' is identical to that of the external supply voltage 'VDD'. Subsequently, if the DLL enable signal 'dllen' is disabled and the initial voltage control signal 'ivcnt' is enabled, since the seventeenth transistor 'TR17' is 'turned on', the voltage of the eighth node 'N8', that is, the level of the control voltage 'Vctrl' is decreased. At this time, the voltage of the eighth node 'N8' is not rapidly decreased due to the disposition of the second capacitor 'C2'. Further, the level of the control voltage 'Vctrl' is continuously decreased to the timing at which the initial voltage control signal 'ivcnt' is disabled.

If the initial voltage control signal 'ivcnt' is enabled, since the eighteenth transistor 'TR18' of the reference voltage generating section 230 is turned on, the reference voltage 'Vref' applied to the ninth node 'N9' has a level that is obtained by dividing the external supply voltage 'VDD' according to a resistance ratio of the first and second resistors 'R1' and 'R2'. At this time, the resistance ratio of the first and second resistors 'R1' and 'R2' must be properly set such that the level of the reference voltage 'Vref' becomes the reference level of the control voltage 'Vctrl'.

Figure 8:
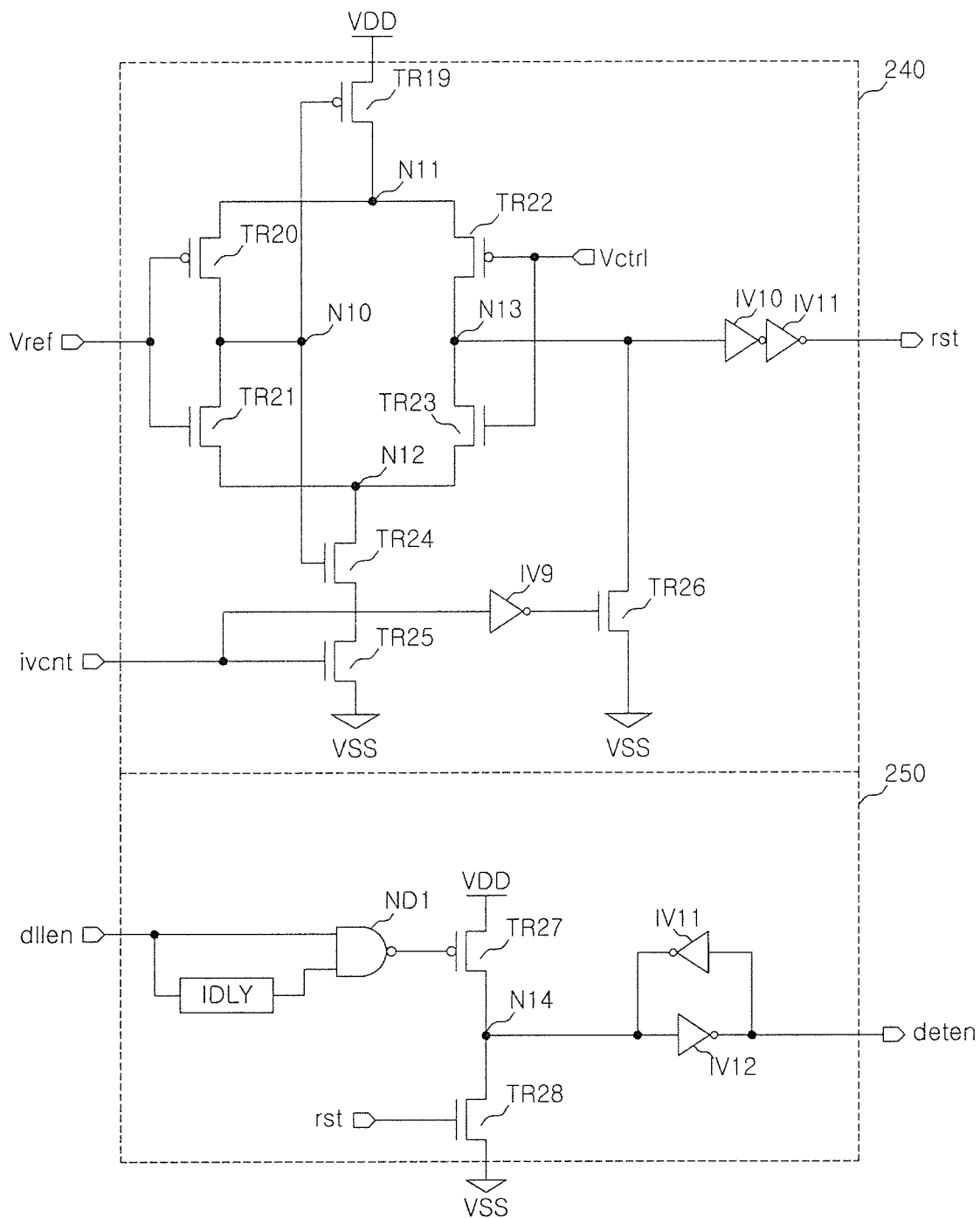
FIG. 8 is a detailed circuit diagram of an example of a voltage comparing section and a detection enable control section shown in FIG. 5.

FIG. 8 is a detailed circuit diagram of an example of the voltage comparing section 240 and the detection enable control section 250 shown in FIG. 5.

As illustrated in FIG. 8, the voltage comparator 240 can include nineteenth to twenty-sixth transistors 'TR19' to 'TR26', and ninth to eleventh inverters 'IV9' to 'IV11'.

The nineteenth transistor 'TR19' may be configured to include a gate coupled with a tenth node 'N10', a source receiving the external supply voltage 'VDD', and a drain coupled to an eleventh node 'N11'. The twentieth transistor 'TR20' may be configured such that a gate thereof receives the reference voltage 'Vref', a source thereof is coupled to the eleventh node 'N11', and a drain thereof is coupled to the tenth node 'N10'. The twenty-first transistor 'TR21' may be configured such that a gate thereof receives the reference voltage 'Vref', a drain thereof is coupled to the tenth node 'N10', and a source thereof is coupled to a twelfth node 'N12'.

The twenty-second transistor 'TR22' may include a gate receiving the control voltage 'Vctrl', a source coupled to the eleventh node 'N11', and a drain coupled to a thirteenth node 'N13'. The twenty-third transistor 'TR23' may be configured such that a gate thereof receives the control voltage 'Vctrl', a drain thereof is coupled to the thirteenth node 'N13', and a source thereof is coupled to the twelfth node 'N12'. The twenty-fourth transistor 'TR24' may include a gate coupled to the tenth node 'N10' and a drain coupled with the twelfth node 'N12'. The twenty-fifth transistor 'TR25' may be configured such that a gate thereof receives the initial voltage control signal 'ivcnt', a drain thereof is coupled to a source of the twenty-fourth transistor 'TR24', and a source thereof is grounded to a ground terminal VSS.

The ninth inverter 'IV9' can be configured to receive the initial voltage control signal 'ivcnt'. The twenty sixth transistor 'TR26' can include a gate receiving an output signal of the ninth inverter 'IV9', a drain coupled with the thirteenth node 'N13', and a source grounded to the ground terminal VSS. The tenth inverter 'IV10' can be configured to receive the voltage of the thirteenth node 'N13'. The eleventh inverter 'IV11' can be configured to receive an output signal of the tenth inverter 'IV10' and output the reset signal 'rst'.

The detection enable control section 250 can include an inversion delayer 'IDLY', a first NAND gate 'ND1', twenty-seventh and twenty eighth-transistors 'TR27' and 'TR28', and twelfth and thirteenth inverters 'IV12' and 'IV13'.

The inversion delayer 'IDLY' can be configured to receive the DLL enable signal 'dllen'. The first NAND gate 'ND1' can be configured to receive the DLL enable signal 'dllen' and a signal output by the inversion delayer 'IDLY'. The twenty-seventh transistor 'TR27' may be configured such that a gate thereof receives an output signal of the first NAND gate 'ND1', a source thereof receives the external supply voltage 'VDD', and a drain thereof is coupled to a fourteenth node 'N14'. The twenty-eighth transistor 'TR28' can include a gate receiving the reset signal 'rst', a drain coupled with the fourteenth node 'N14', and a source grounded to the ground terminal VSS. The twelfth inverter 'IV12' can be configured to receive the voltage applied to the fourteenth node 'N14' to output the detection enable signal 'deten'. The thirteenth inverter 'IV13' forms a latch together with the twelfth inverter 'IV12'.

If the initial voltage control signal 'ivcnt' is disabled, the voltage comparing section 240, configured as described above, disables the reset signal 'rst'. In contrast, if the initial voltage control signal 'ivcnt' is enabled, the voltage comparing section 240 compares the level of the reference voltage 'Vref' with that of the control voltage 'Vctrl' so as to enable the reset signal 'rst'. As described above, if the level of the reference voltage 'Vref' is lower than that of the control voltage 'Vctrl', it follows that the voltage level of the thirteenth node 'N13' is less than that of the tenth node 'N10', and the reset signal 'rst' is disabled. However, if the level of the reference voltage 'Vref' is greater than that of the control voltage 'Vctrl', the voltage level of the thirteenth node 'N13' is higher than that of the tenth node 'N10', so that the reset signal 'rst' is enabled.

In the detection enable control section 250, the output signal of the first NAND gate 'ND1' is implemented as the form of a low pulse signal. If the DLL enable signal 'dllen' is enabled, the output signal of the first NAND gate 'ND1' is enabled at a low level. Thus, the twenty-seventh transistor 'TR27' is 'turned on' and a high level voltage is supplied to the fourteenth NAND gate 'ND14'. As a result, the detection enable signal 'deten' is disabled. Then, the disabled state of the detection enable signal 'deten' is maintained even if the output signal of the first NAND gate 'ND1' is disabled.

Thereafter, if the reset signal 'rst' is enabled, the twenty-eighth transistor 'TR28' is 'turned on' and the voltage level of the fourteenth NAND gate 'ND14' transitions to a low level. Thus, the detection enable signal 'deten' is enabled. Then, the enabled state of the detection enable signal 'deten' is maintained even if the reset signal 'rst' is disabled.

Figure 9:
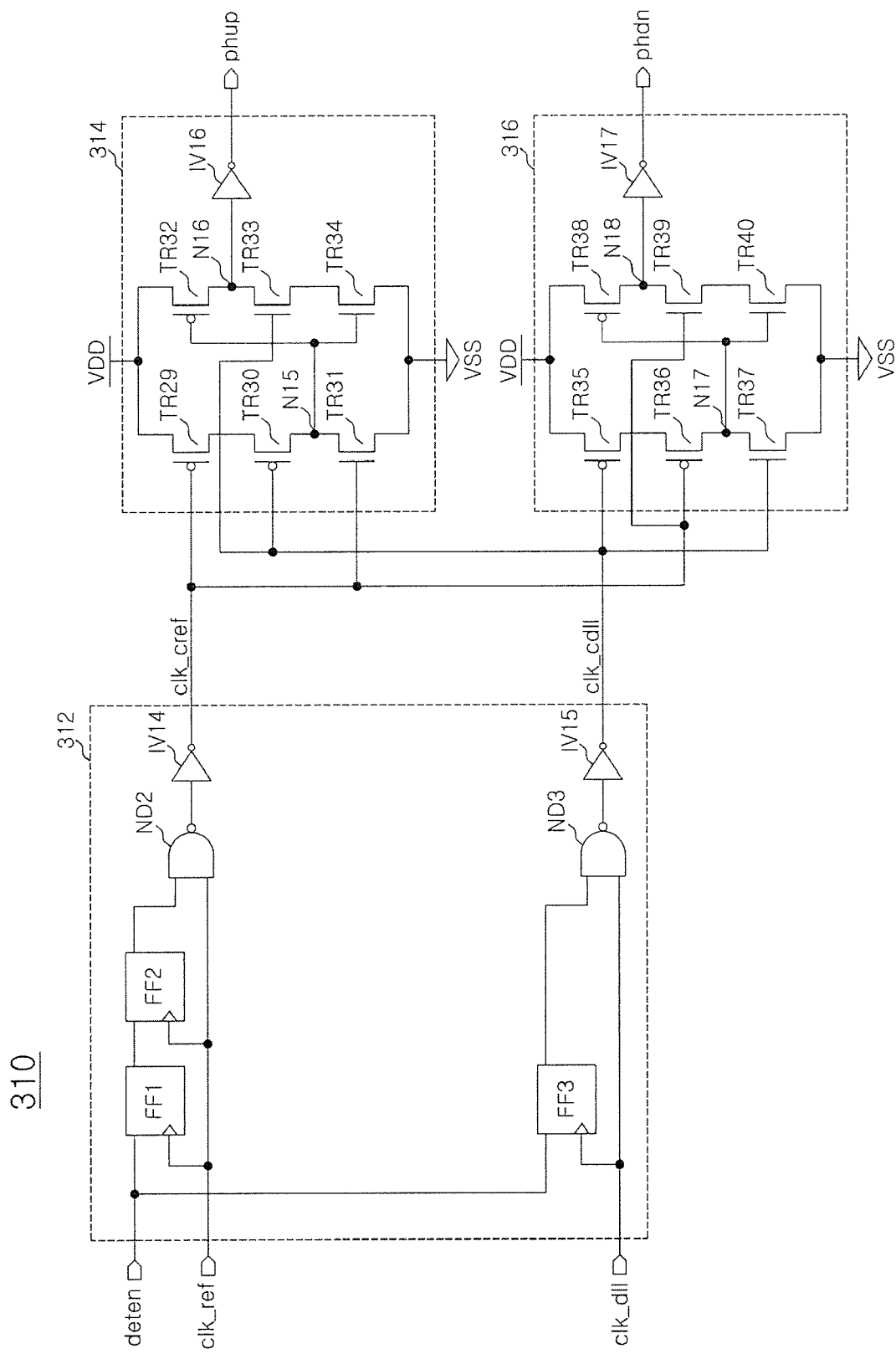
FIG. 9 is a detailed circuit diagram of an example of a phase detector shown in FIG. 1.

FIG. 9 is a detailed circuit diagram of an example of the phase detector 310 shown in FIG. 1.

As shown in FIG. 9, the phase detector 310 can include a timing control section 312, an up signal generating section 314, and a down signal generating section 316.

The timing control section 312 can be configured to generate a control reference clock signal 'clk_cref' and a control DLL clock signal 'clk_cdll' by controlling activation timing of the reference clock signal 'clk_ref' and the DLL clock signal 'clk_dll'. The timing control section 312 can include first to third flip-flops 'FF1' to 'FF3', second and third NAND gates 'ND2' and 'ND3', and fourteenth and fifteenth inverters 'IV14' and 'IV15'.

The first flip-flop 'FF1' can be configured to latch the detection enable signal 'deten' in response to the reference clock signal 'clk_ref'. The second flip-flop 'FF2' can be configured to latch an output signal of the first flip-flop 'FF1' in response to the reference clock signal 'clk_ref'. The second NAND gate 'ND2' can be configured to receive an output signal of the second flip-flop 'FF2' and the reference clock signal 'clk_ref'. The fourteenth inverter 'IV14' can be configured to receive a signal output by the second NAND gate 'ND2' to output the control reference clock signal 'clk_cref'. The third flip-flop 'FF3' can be configured to latch the detection enable signal 'deten' in response to the DLL clock signal 'clk_dll'. The third NAND gate 'ND3' can be configured to receive an output signal of the third flip-flop 'FF3' and the DLL clock signal 'clk_dll'. The fifteenth inverter 'IV15' can be configured to receive an output signal of the third NAND gate 'ND3' to output the control DLL clock signal 'clk_cdll'.

The up signal generating section 314 can be configured to generate the phase up signal 'phup' according to the phases of the control reference clock signal 'clk_cref' and the control DLL clock signal 'clk_cdll'. The up signal generating section 314 can include twenty-ninth to thirty-fourth transistors 'TR29' to 'TR34', and a sixteenth inverter 'IV16'.

The twenty-ninth transistor 'TR29' may be configured such that a gate thereof receives the control reference clock signal 'clk_cref' and a source thereof receives the external supply voltage 'VDD'. The thirtieth transistor 'TR30' may be configured to include a gate receiving the control DLL clock signal 'clk_cdll', a source coupled to a drain of the twenty-ninth transistor 'TR29', and a drain coupled to a fifteenth node 'N15'. The thirty-first transistor 'TR31' can include a gate receiving the control reference clock signal 'clk_cref', a drain coupled with the fifteenth node 'N15', and a source grounded to the ground terminal VSS. The thirty-second transistor 'TR32' may be configured to include a gate coupled to the fifteenth node 'N15', a source receiving the external supply voltage 'VDD', and a drain coupled to the sixteenth node 'N16'. The thirty-third transistor 'TR33' may be configured such that a gate thereof receives the control DLL clock signal 'clk_cdll', and a drain thereof is coupled to the sixteenth node 'N16'. The thirty-fourth transistor 'TR34' can include a gate coupled to the fifteenth node 'N15', a drain coupled to a source of the thirty-third transistor 'TR33', and a source grounded to a ground terminal VSS. The sixteenth inverter 'IV16' can be configured to receive a voltage of the sixteenth node 'N16' to output the phase up signal 'phup'.

The down signal generating section 316 can be configured to generate the phase down signal 'phdn' according to the phases of the control reference clock signal 'clk_cref' and the control DLL clock signal 'clk_cdll'. The down signal generating section 316 can include thirty-fifth to fortieth transistors 'TR35' to 'TR40', and a seventeenth inverter 'IV17'.

The thirty-fifth transistor 'TR35' may be configured to include a gate receiving the control DLL clock signal 'clk_cdll', and a source receiving the external supply voltage 'VDD'. The thirty-sixth transistor 'TR36' may be configured such that a gate thereof receives the control reference clock signal 'clk_cref', a source thereof is coupled with a drain of the thirty-fifth transistor 'TR35', and a drain thereof is coupled with a seventeenth node 'N17'. The thirty-seventh transistor 'TR37' can include a gate receiving the control DLL clock signal 'clk_cdll', a drain coupled with the seventeenth node 'N17', and a source grounded to the ground terminal VSS. The thirty-eighth transistor 'TR38' may be configured such that a gate thereof is coupled with the seventeenth node 'N17', a source thereof receives the external supply voltage 'VDD', and a drain thereof is coupled to an eighteenth node 'N18'. The thirty-ninth transistor 'TR39' can include a gate receiving the control reference clock signal 'clk_cref' and a drain coupled with the eighteenth node 'N18'. The fortieth transistor 'TR40' can include a gate coupled with the seventeenth node 'N17', a drain coupled with a source of the thirty-ninth transistor 'TR39', and a source grounded to the ground terminal VSS. The seventeenth inverter 'IV17' can be configured to receive a voltage of the eighteenth node 'N18' and output the phase down signal 'phdn'.

According to the timing control section 312, configured as described above, the control DLL clock signal 'clk_cdll' is toggled prior to the control reference clock signal 'clk_cref'. In detail, if the detection enable signal 'deten' is enabled, the output signal of the second flip-flop 'FF2' can transition to a high voltage level only when the reference clock 'clk_ref' is toggled twice. However, even when DLL clock signal 'clk_dll' is toggled only once, since the output signal of the third flip-flop 'FF3' may have a high voltage level, the control DLL clock signal 'clk_cdll' output from the fifteenth inverter 'IV15' is toggled prior to the control reference clock signal 'clk_cref' output from the fourteenth inverter 'IV14'.

The up signal generating section 314 enables the phase up signal 'phup' when the voltage level of the control DLL clock signal 'clk_cdll' is at a high level and the voltage level of the control reference clock signal 'clk_cref' is at a low level. In contrast, the down signal generating section 316 enables the phase down signal 'phdn' when the voltage level of the control reference clock signal 'clk_cref' is at a high level and the voltage level of the control DLL clock signal 'clk_cdll' is at a low level. In the phase detector 310, configured as described above, the phase up signal 'phup' and the phase down signal 'phdn' can be implemented as pulse signals, respectively, and the phase up signal 'phup' and the phase down signal 'phdn' cannot be enabled at the same time. As described above, the control DLL clock signal 'clk_cdll' is toggled prior to the control reference clock signal 'clk_cref', so that the phase up signal 'phup' is enabled prior to the enabling phase down signal 'phdn' in the initial operation of the phase detector 310, thus, the level of the control voltage 'Vctrl' can be increased.

As described above, the DLL circuit, which is implemented as an analog circuit in order to generate the multiphase clock signal, decreases the level of the control voltage in the initial operation thereof, and activates the phase detector if the level of the control voltage reaches the reference level. At this time, the phase detector is configured to enable the phase up signal prior to the phase down signal, so that the level of the control voltage is increased. That is, the control voltage in the initial operation of the DLL circuit is set such that the control voltage has a level approximately equal to (but slightly lower than) a level of the control voltage expected when locking is completed. Then, the locking operation is performed by increasing the level of the control voltage. Thus, as illustrated through embodiments of the present invention, the locking time of the DLL circuit can be reduced. Further, according to the present invention, even if the delay amount applied to the reference clock signal by the DLL circuit is reduced, a stable operation can be performed.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A delay locked loop (DLL) circuit comprising:
    a delay unit configured to generate a DLL clock signal by delaying a reference clock signal and adjust a delay amount in response to a level of a control voltage, the delay unit comprising:
        a bias generating section configured to generate a pull-up bias voltage and a pull-down bias voltage in response to the level of the control voltage; and
        a delay line configured to output the DLL clock signal by delaying the reference clock signal in response to the pull-up bias voltage and the pull-down bias voltage;
    an initial operation control unit configured to control an initial level of the control voltage and generate a detection enable signal; and
    a delay control unit configured to generate the control voltage by comparing a phase of the reference clock signal with a phase of the DLL clock signal in response to the detection enable signal.

2. The DLL circuit as claimed in claim 1, wherein the initial operation control unit is configured to decrease the level of the control voltage when a DLL enable signal is enabled, and enable the detection enable signal when the control voltage is equal to a predetermined reference level.

3. The DLL circuit as claimed in claim 1, wherein the delay control unit comprises:
    a phase detector configured to generate a phase detection signal by comparing the phase of the reference clock signal and the phase of the DLL clock signal when the detection enable signal is enabled;
    a charge pump configured to generate a pumping voltage through a voltage pumping operation in response to the phase detection signal; and
    a low pass filter configured to generate the control voltage by filtering the pumping voltage.

4. The DLL circuit as claimed in claim 3, wherein the phase detection signal comprises a phase up signal and a phase down signal, and wherein the phase detector enables the phase up signal prior to the phase down signal at a first operation.

5. The DLL circuit as claimed in claim 4, wherein the phase detector comprises:
    a timing control section configured to generate a control reference clock signal and a control DLL clock signal by controlling an activation timing of the reference clock signal and the DLL clock signal;
    an up signal generating section configured to generate the phase up signal according to phases of the control reference clock signal and the control DLL clock signal; and
    a down signal generating section configured to generate the phase down signal according to the phases of the control reference clock signal and the control DLL clock signal.

6. The DLL circuit as claimed in claim 4, wherein the charge pump is configured to increase a level of the pumping voltage when the phase up signal is enabled and decrease the level of the pumping voltage when the phase down signal is enabled.

7. A DLL (delay locked loop) circuit comprising:
    an initial operation control unit configured to decrease a level of a control voltage to a reference level in an initial operation and then enable a detection enable signal;
    a phase detector configured to generate a phase detection signal by comparing a phase of a reference clock signal and a phase of a DLL clock signal in response to the detection enable signal;
    a charge pump configured to generate a pumping voltage through a voltage pumping operation in response to the phase detection signal; and
    a low pass filter configured to generate the control voltage by filtering the pumping voltage.

8. The DLL circuit as claimed in claim 7, wherein the initial operation control unit comprises:
    an initial voltage control section configured to generate an initial voltage control signal in response to a DLL enable signal and a reset signal;
    a control voltage adjusting section configured to adjust the level of the control voltage in response to an external supply voltage and the initial voltage control signal;
    a reference voltage generating section configured to generate a reference voltage in response to the external supply voltage and the initial voltage control signal;
    a voltage comparing section configured to generate the reset signal by comparing a level of the reference voltage and the level of the control voltage in response to the initial voltage control signal; and
    a detection enable control section configured to generate the detection enable signal in response to the DLL enable signal and the reset signal.

9. The DLL circuit as claimed in claim 8, wherein the initial voltage control section is configured to enable the initial voltage control signal when the DLL enable signal is enabled and disable the initial voltage control signal when the reset signal is enabled.

10. The DLL circuit as claimed in claim 8, wherein the control voltage adjusting section is configured to set the control voltage to have a voltage level substantially identical to that of the external supply voltage before the initial voltage control signal is enabled, decrease the level of the control voltage when the initial voltage control signal is enabled, and stop decreasing the control voltage when the initial voltage control signal is disabled.

11. The DLL circuit as claimed in claim 8, wherein the reference voltage generating section comprises resistors, the reference voltage generating section being configured to generate the reference voltage by dividing the external supply voltage according to a resistance ratio of the resistors when the initial voltage control signal is enabled, and wherein a level of the reference voltage serves as the reference level.

12. The DLL circuit as claimed in claim 8, wherein the voltage comparing section is configured to enable and disable the reset signal by comparing the level of the reference voltage and the level of the control voltage when the initial voltage control signal is enabled and disable the reset signal when the initial voltage control signal is disabled.

13. The DLL circuit as claimed in claim 8, wherein the detection enable control section is configured to disable the detection enable signal when the DLL enable signal is enabled, enable the detection enable signal when the reset signal is enabled, and maintain an enabled state of the detection enable signal regardless of a state of the reset signal.

14. The DLL circuit as claimed in claim 7, wherein the phase detection signal comprises a phase up signal and a phase down signal, and wherein the phase detector is configured to enable the phase up signal prior to the phase down signal in the first operation.

15. The DLL circuit as claimed in claim 14, wherein the phase detector comprises:
   a timing control section configured to generate a control reference clock signal and a control DLL clock signal according to activation timing of the reference clock signal and the DLL clock signal;
   an up signal generating section configured to generate the phase up signal according to phases of the control reference clock signal and the control DLL clock signal; and
   a down signal generating section configured to generate the phase down signal according to the phases of the control reference clock signal and the control DLL clock signal.

16. The DLL circuit as claimed in claim 7, wherein the charge pump is configured to increase a level of the pumping voltage when the phase up signal is enabled, and degrade the level of the pumping voltage when the phase down signal is enabled.

17. The DLL circuit as claimed in claim 7, wherein the delay unit comprises:
   a bias generating section configured to generate a pull-up bias voltage and a pull-down bias voltage in response to the level of the control voltage; and
   a delay line configured to output the DLL clock signal by delaying the reference clock signal in response to the pull-up bias voltage and the pull-down bias voltage.

18. A method of controlling a DLL (delay locked loop) circuit, the method comprising:
   controlling a level of a control voltage such that the level of the control voltage is less than a reference level and enabling a detection enable signal;
   enabling a phase up signal in response to the detection enable signal;
   increasing the level of the control voltage in response to the phase up signal; and
   generating a DLL clock signal by delaying a reference clock signal in response to the control voltage, wherein generating the DLL clock signal comprises:
   generating a pull-up bias voltage and a pull-down bias voltage in response to the level of the control voltage; and
   generating the DLL clock signal by delaying the reference clock signal in response to the pull-up bias voltage and the pull-down bias voltage while adjusting a frequency of the DLL clock signal in response to the control voltage.

19. The method as claimed in claim 18, wherein the controlling of the level of the control voltage comprises:
   enabling an initial voltage control signal when a DLL enable signal is enabled;
   decreasing the level of the control voltage in response to the initial voltage control signal and generating a reference voltage;
   enabling a reset signal when the level of the control voltage is less than a level of the reference voltage;
   enabling the detection enable signal in response to the reset signal; and
   disabling the initial voltage control signal and disabling the reset signal.

20. The method as claimed in claim 18, wherein the increasing of the level of the control voltage comprises:
   performing a voltage pumping operation in response to the phase up signal while increasing a level of a pumping voltage to generate a pumping voltage; and
   generating the control voltage by filtering the pumping voltage.

* * * * *